United States Patent [19]

Kazui

[11] Patent Number: 5,121,192
[45] Date of Patent: Jun. 9, 1992

[54] SOLID-STATE COLOR IMAGING DEVICE

[75] Inventor: Kazuhiro Kazui, Hashima, Japan

[73] Assignee: Sanyo Electric Co., Ltd., Osaka, Japan

[21] Appl. No.: 597,828

[22] Filed: Oct. 15, 1990

[30] Foreign Application Priority Data

Oct. 19, 1989 [JP] Japan .................. 1-272873

[51] Int. Cl.⁵ .............. H04N 9/07; H04N 9/077
[52] U.S. Cl. ............................ 358/44; 358/43
[58] Field of Search ............... 358/213.18, 44, 43, 358/41, 48, 51; 357/24 LR

[56] References Cited

U.S. PATENT DOCUMENTS

| | | | |
|---|---|---|---|
| 4,477,832 | 10/1984 | Takemura | 358/44 |
| 4,567,510 | 1/1986 | Tanaka et al. | 358/44 |
| 4,760,441 | 7/1988 | Kohno | 358/44 |
| 4,939,573 | 7/1990 | Teranishi et al. | 358/44 |
| 4,951,130 | 8/1990 | Iizuka et al. | 358/44 |

OTHER PUBLICATIONS

Patent Abstracts of Japan, vol. 8, No. 63 (E-233) 24th Mar., 1984 & JP-A-58 210 780 (Tokyo Shibaura Denki K.K.) Aug. 12, 1983. Abstract only.
Session XVIII: Imaging and Signal Processing from 1983 IEEE International Solid-State Circuits Conference.
Vertical Color Crosstalk Suppression of Frame Transfer CCD Imager with Cross-gate structure from Proceedings of the 1984 International Symposium on Noise and Clutter Refjection in Radars and Imaging Sensors.
½ Inch 768(H)×492(V) Pixel CCD Image Sensor from IEDM 1985.
IEDM, San Francisco, 9th-12th Dec. 1984, pp. 44-47, IEDM; N. Mitani et al.: "A Single Chip ½" Frame Transfer CCD Color Image Sensor".
Patent Abstracts of Japan, vol. 9, No. 225 (E-342) 1948, 11th Sep., 1985; & JP-A-60 81 993 (Sharp K.K.) Oct. 5, 1985. No English Translation.
Patent Abstracts of Japan, vol. 12, No. 80 (E-590), 12 Mar., 1988; & JP-A-62 219 568 (Shoichi Tanaka) Sep. 26, 1987. Abstract only.

Primary Examiner—James J. Groody
Assistant Examiner—Safet Metjahic
Attorney, Agent, or Firm—Darby & Darby

[57] ABSTRACT

A solid state color imaging device includes a plurality of photoreceptor elements aligned vertically and horizontally, with a color separation filter disposed thereover to make each element sensitive to a particular color. A white band filter is provided that extends between the rows of horizontally aligned elements, where the transfer electrodes between the rows of elements are located, to equalize the charge leaking into an element of one row and the charge leaking out of the adjacent element on the next row.

3 Claims, 5 Drawing Sheets

SOLID-STATE COLOR IMAGING DEVICE

BACKGROUND OF THE INVENTION

1. Field of the Invention

The present invention is related to a color solid imaging device comprising a color separation filter, and particularly to a frame transfer type CCD solid-state color imaging device.

2. Description of the Prior Art

In a single-layer color imaging device, a color separation filter with a mosaic, stripe or other pattern is mounted on the light receptor surface of the CCD solid-state color imaging device in the imaging device, and the elements on the receptor surface are made to correspond to specific color components. When a mosaic-pattern color separation filter is used, horizontal resolution is greater than when a striped-pattern color separation filter is used, but a problem exists in that the processing of video signal obtained from the CCD becomes complex.

FIG. 1 is a diagrammatic view showing the prior art frame transfer type CCD solid-state color imaging device to which is mounted a mosaic color separation filter.

On the receptor surface of the CCD, multiple channel areas 1 are provided extending in the vertical direction separated by channel separation areas 2 therebetween. A two-layer structure transfer electrodes 3 and 4 is formed perpendicular to the multiple channel areas 1 through an insulation layer. In addition, the upper transfer electrode 4 is formed on channel separation areas 2 with a narrow width to improve transfer efficiency. To these transfer electrodes 3 and 4 is applied, for example, a four-phase transfer clock, and the information charge produced in the multiple channel areas 1 is transferred along the multiple channel areas 1.

The mosaic color separation filter 10 mounted on the receptor surface is divided according to the pixels of the receptor surface so that yellow (Ye), cyan (Cy), green (G), and white (W) filters is applied to each divided area in a specific order. The elements on the receptor surface are separated in the vertical direction by the channel separation areas 2, and are separated in the horizontal direction by the potential barrier formed by the transfer electrodes 3 and 4. Specifically, the area near the end of the transfer electrodes 3 and 4 becomes the boundary of each element, and the width of one transfer electrode 3 and 4 is equivalent to one element. Therefore, the color separation filter 10 is divided in the vertical direction along the channel separation areas 2, and is divided in the horizontal direction along the edge of the transfer electrodes 3 and 4.

In a CCD of this type, two elements in the vertical direction are normally read simultaneously, and interlace drive is used to invert the combinations of elements in each field to improve resolution. Specifically, in odd fields, elements in line n and line n+1 are read simultaneously, and in even fields elements in line n−1 and line n are read simultaneously. The brightness signal and chrominance signal are then obtained from the sum and difference, respectively, of the signals read from the CCD in the horizontal direction. For example, when the colors are arranged as shown in FIG. 1, the chrominance components for W and Ye, G and Cy are mixed and read in the odd fields, and the brightness signal is obtained from (W+Ye)+(G+Cy), and the chrominance signal is obtained from (W+Ye)−(G+Cy). Similarly, in the even fields, the color components for Ye and W, Cy and G are mixed and read, and the brightness signal is obtained from (Ye+W) +(Cy+G), and the chrominance signal is obtained from (Ye+W)−(Cy+G). Thus, because $W=R+G+B$, $Ye=R+G$, and $Cy=G+B$ (where R=red, B=blue), the brightness signal becomes $2R+4G+2B$ combining the odd and even fields. Furthermore, the chrominance signal is 2R with both fields. If Ye and Cy are inserted, the chrominance signal becomes 2B.

However, the receptor surface of a frame transfer CCD as shown in FIG. 1 has insufficient element separation in the horizontal direction compared with an interline transfer-type CCD, which also has channel separation areas in the horizontal direction, because the element separation in the horizontal direction is formed by the potential barrier formed by the transfer electrodes 3 and 4. Thus, there is the possibility of part of the information charge for each element leaking to the element adjacent in the vertical direction. For example, in the G element as shown in FIG. 2, the information charge of one part (g) of the G element leaks out, and the information charge of one part (y) of the Y element leaks in. Such information charge leakage is produced in each element, and error in the information charge of each element occurs. If the quantity of this information charge leakage is expressed as $\Delta Ye$, $\Delta Cy$, $\Delta G$, and $\Delta W$, the brightness signal and chrominance signal in even fields become $(Ye+W-\Delta Ye+\Delta Cy)+(Cy+G-\Delta Cy+\Delta Ye)$, and $(Ye+W-\Delta Ye+\Delta Cy)-(Cy+G-\Delta Cy+\Delta Ye)$, respectively, and can be calculated as $2R+4G+2B$ and $2R-2\Delta Ye+2\Delta Cy$. Also, the brightness signal and $2R-2\Delta Cy$. also, the brightness signal and chrominance signal in the odd fields become $(W+Ye-\Delta W+\Delta W)+(G+Cy-\Delta G+\Delta G)$, and $(W+Ye-\Delta W+\Delta W)-(G+Cy-\Delta G+\Delta G)$, respectively, and can be calculated as $2R+4G+2B$ and 2R. Therefore, the brightness signal is the same as in that case in which information charge leakage is not considered, but an error of $(-2\Delta Ye+2\Delta Cy)$ occurs in the chrominance signal. Thus, the video signal contains error in the color component in each field, resulting in flicker in the playback image.

One countermeasure to this flicker is to provide a color separation filter configured according to the range of expected information charge leakage, but it is extremely difficult to actually provide a filter so formed for color separation because the configuration of each separation area in the color separation filter becomes complex. Furthermore, while it has been proposed, for example in Japanese Patent Publication (examined) No. 60-41872, to form a light barrier range of a constant width from aluminum, etc., at the boundary area of each separation area, this is not suited to a frame transfer CCD wherein there are no channel separation areas in the horizontal direction, and such problems result in the reduction of the light sensitivity, and the difficulty in achieving complete light blocking.

SUMMARY OF THE INVENTION

Therefore, the object of the present invention is to provide a solid-state color imaging device which can prevent the generation of flicker in the playback picture caused by leakage of information charge between elements.

In order to achieve the aforementioned objective, a solid-state color imaging device according to the present invention comprises a plurality of elements aligned vertically and horizontally, each element sensitive to particular color, and white band filter means extending between rows of horizontally aligned elements.

According to a preferred embodiment, a solid-state color imaging device comprises a semiconductor substrate having a primary layer; channel separation means provided in said semiconductor substrate for separating said primary layer (1) into channel areas extending parallel to each other; transfer electrodes provided on said semiconductor substrate in a direction orthogonal to said channel areas for controlling the potential in said semiconductor substrate; a color separation filter means provided over said transfer electrodes, said color separation filter means being divided vertically along said channel areas and horizontally along opposite sides of said transfer electrodes into a plurality of segments which are aligned vertically and horizontally, each divided segment passing incident light of a specific wavelength; and white band filter means extending between rows of horizontally aligned segments.

According to the present invention, by making transparent to the incident light along the top and bottom boundary area of each element at which leakage of the information charge is expected, the information charge leaking out from each element can be made equivalent to the information charge leaking in to each element. Thus, the charge which leaked out from each element can be compensated by the charge leaking in to each element, thereby canceling the error component in the information charge of each element, and making it possible to obtain a information charge with low error.

BRIEF DESCRIPTION OF THE DRAWINGS

These and other objects and features of the present invention will become clear from the following description taken in conjunction with the preferred embodiment thereof with reference to the accompanying drawings throughout which like parts are designated by like reference numerals, and in which.

DETAILED DESCRIPTION OF THE PREFERRED EMBODIMENTS

Figure 3:
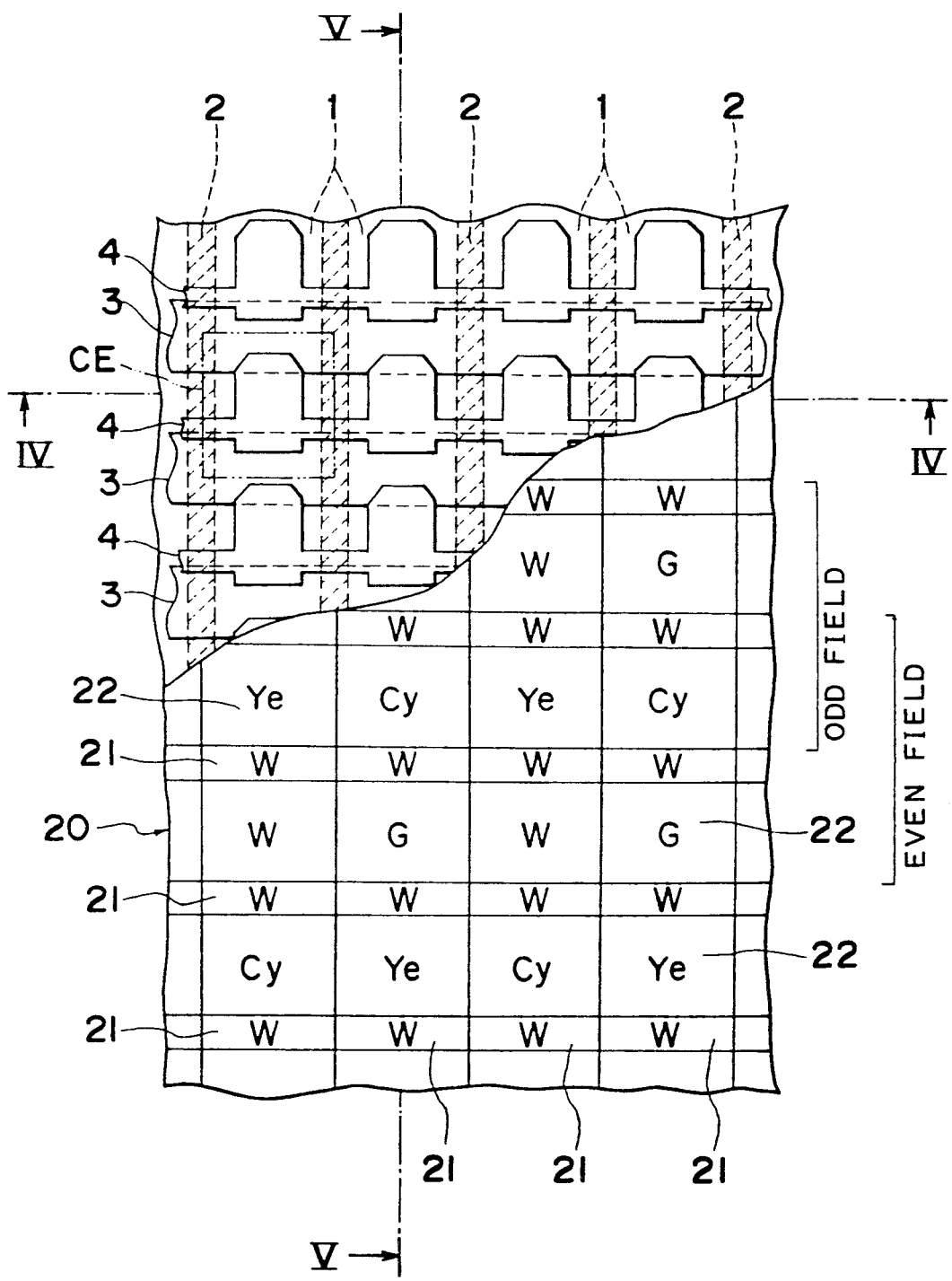
FIG. 3 is a diagrammatic view showing the major components of a solid-state color imaging device according to the present invention.

Referring to FIG. 3, major parts of a solid-state color imaging device according to the present invention is shown. In FIG. 3, the multiple channel areas 1, channel separation areas 2, and transfer electrodes 3 and 4 are the same as those shown in FIG. 1, and like parts are indicated by like reference numbers.

The present invention is characterized in the provision of a region 21 transparent to white light at the boundary area of the dividing areas of the color separation filter 20. Specifically, the color separation filter 20 has a transparent region 21 provided horizontally along the sides of the transfer electrodes 3 and 4.

Figure 4:
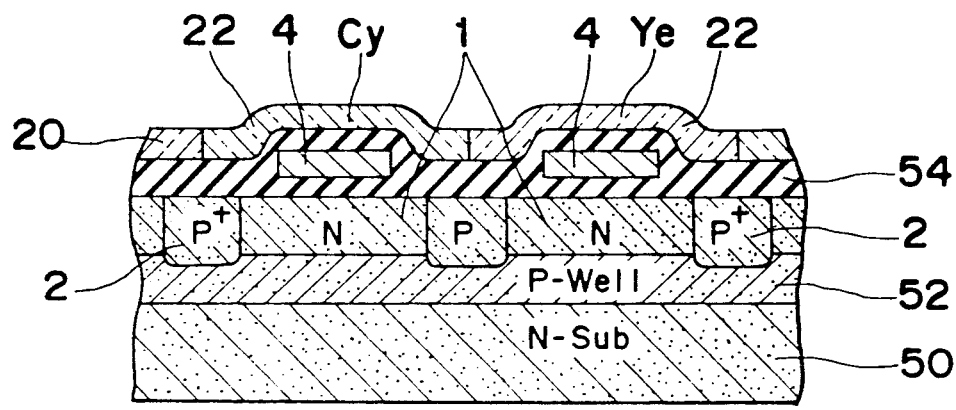
FIG. 4 is a cross-sectional view taken along a line IV—IV shown in FIG. 3.
Figure 5:
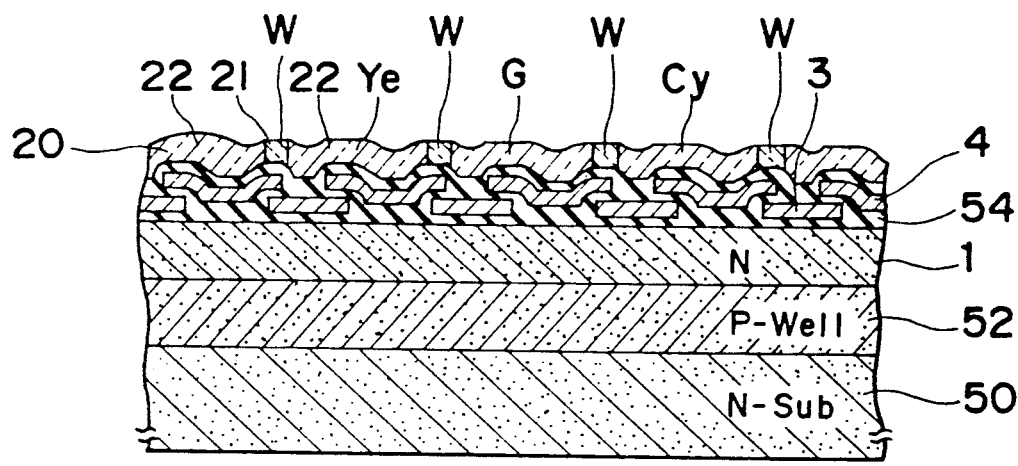
FIG. 5 is a cross-sectional view taken along a line V—V shown in FIG. 3.

The solid-state color imaging device according to one embodiment of the present invention, as shown in FIGS. 4 and 5, has an N-type semiconductor substrate 50 over which a P-type diffusion layer 52 is formed. Formed on the diffusion layer 52 are vertically extending N type channel regions 1 separated by vertically extending $P^+$ type channel separation areas 2. After the deposition of a suitable insulation layer 54, transfer electrodes 3 and 4 are provided such that electrode 4 partly overlaps electrode 3. The solid-state color imaging device so constructed is divided vertically along the channel separation areas 2, and horizontally at opposite sides of the overlapping transfer electrodes 3 and 4 to define a plurality of rectangular cells CE (FIG. 3) aligned vertically and horizontally. In this manner, a receptor surface is formed.

Provided over the receptor surface, i.e., transfer electrodes 3 and 4, is a color separation filter 20 having a plurality of filter segments 22 of different colors, such as yellow (Ye), cyan (Cy), white (W) and green (G) in the example shown in FIG. 3, which are aligned vertically and horizontally over each of the cells CE. Thus, one cell CE with one filter segment 22 mounted thereon defines one element of color imaging device.

The color separation filter 20 further has the white filter regions 21 each extending horizontally between the rows of horizontally aligned elements. Thus, when two neighboring elements aligned vertically are considered, the two elements sensitive to different colors are separated by a white band filter 21.

Figure 6:
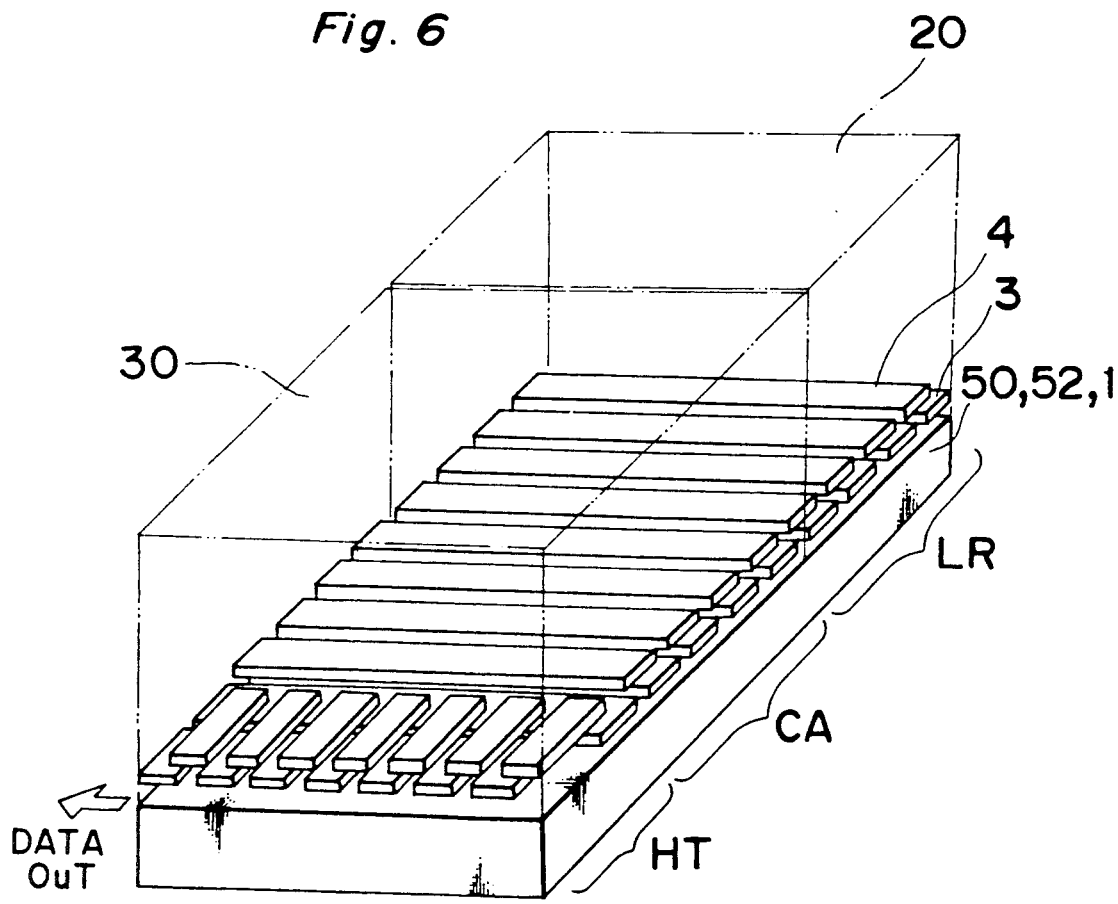
FIG. 6 is a diagrammatic view of a solid-state color imaging device according to the present invention.

As shown in FIG. 6, in addition to a light receiving portion LR where the filter 20 is mounted as described above, the imaging device further has a charge accumulation portion CA and horizontal data transfer portion HT. The charge accumulation portion CA and horizontal data transfer portion HT are covered with a light shielding layer, such as an aluminum layer 30, to prevent portions CA and HT from being exposed to light.

Figure 1:
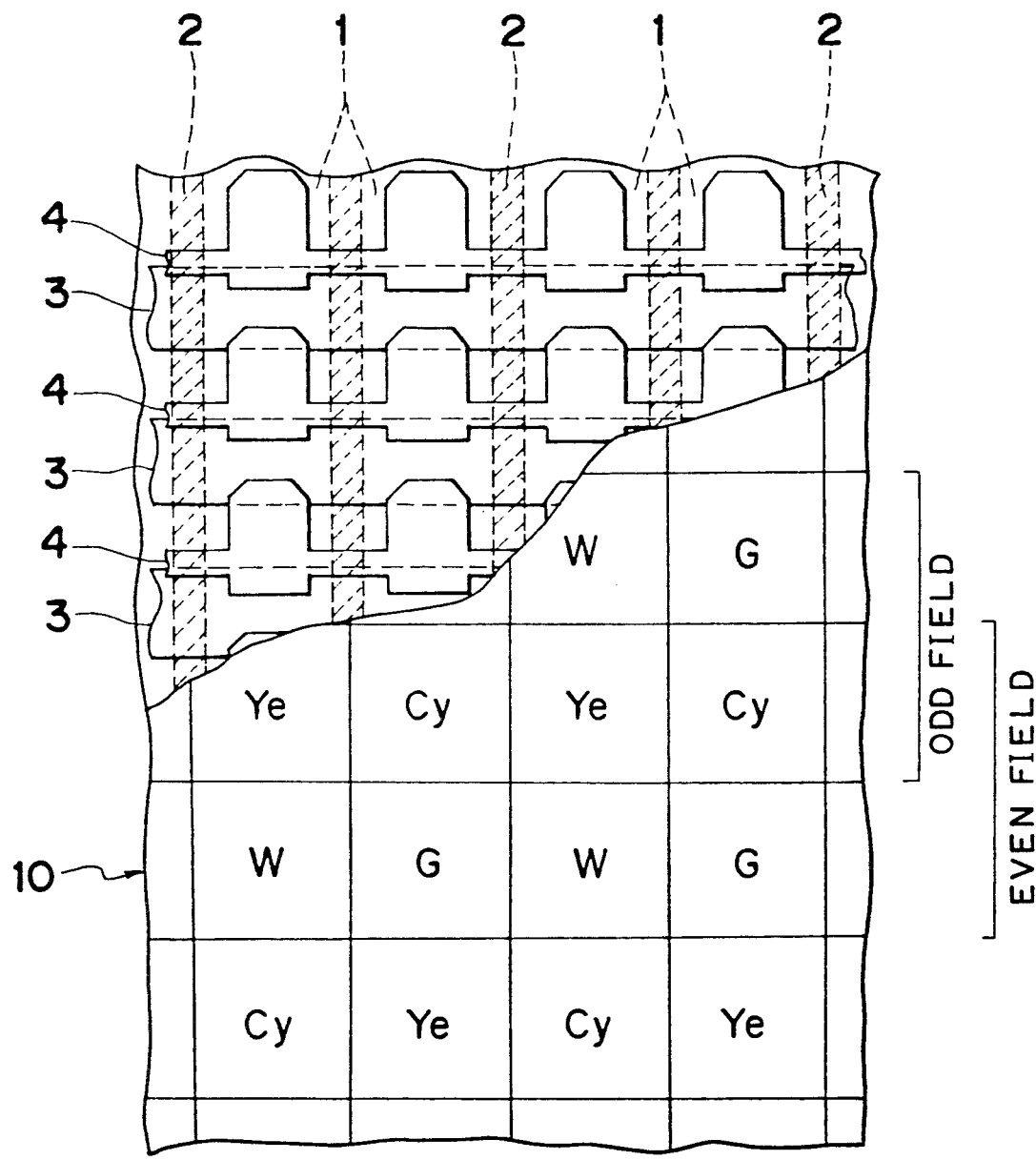
FIG. 1 is a diagrammatic view showing the major components of a prior art solid-state color imaging device.
Figure 2:
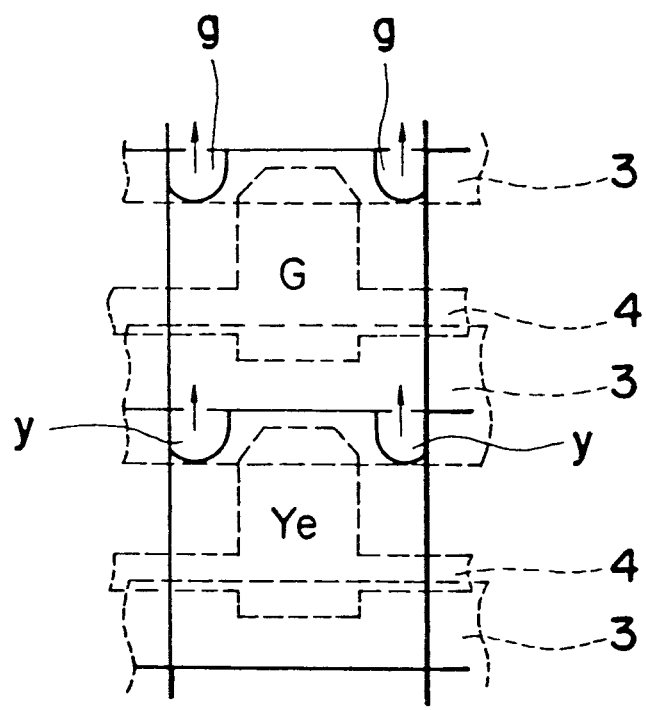
FIG. 2 is a diagrammatic view showing the state of information charge leakage between elements.

Reading of the charged data from each element is accomplished in the same manner as that described with respect to FIG. 1. In odd fields, the charges are read from elements in line n and line n+1 simultaneously and temporarily stored in charge accumulation portion CA, and similarly in even fields, the charges are read from elements in line n−1 and line n and temporarily stored in charge accumulation portion CA, thereby storing charges representing one frame. The accumulated charges of one frame are sequentially read out from the horizontal data transfer portion HT. In addition, the brightness signal is obtained by adding the signals from elements adjacent in the horizontal direction, and the chrominance signal is obtained from the difference of these signals.

In this case, the information charge leaking from each element is that from the area corresponding to the transparent region 21, and the information charge leaking from each element is equivalent. Thus, if the leakage from each element is $\Delta W$, the brightness signal and chrominance signal in the odd fields are $(W+Ye-\Delta W+\Delta W)+(G+Cy-\Delta W+\Delta W)$, and $(W+Ye-\Delta W+\Delta W)-(G+Cy-\Delta W+\Delta W)-$, and can be calculated, respectively, as $2R+4G+2B$ and $2R$. Also, the brightness signal and chrominance signal in the even fields are $(Ye+W-\Delta W+\Delta W)+(Cy+G-\Delta W+\Delta W)$, and $(Ye+W-\Delta W+\Delta W)-(Cy+G-\Delta W+\Delta W)$, and can be calculated, respectively, as 2R+4G+2B and 2R. Therefore, each signal in both fields does not contain ΔW, which expresses the leakage of the information charge, and there is no effect on the chrominance signal even if leakage of the information charge between the elements occurs.

A color separation filter 20 of this type can be obtained by mounting on the receptor surface a sheet filter comprising a layer of a specific color on a transparent substrate, or by a so-called on-chip filter wherein a dyed layer formed on the receptor surface is dyed to a specific color. Because the transparent region 21 of this color separation filter 20 can be formed without forming a colored layer on a transparent substrate, or can be formed without dying a layer, the production process is simplified when compared with the provision of a shield layer of aluminum, etc.

It is to be noted that while the above described embodiment of the present invention was described with a yellow (Ye), cyan (Cy), green (G), and white (W) color separation filter combination, the combination may also be one of complementary colors, including yellow (Ye), cyan (Cy), magenta (Mg), and green (G).

According to the present invention, because distortion of the chrominance signal caused by the leakage of the information charge between elements can be prevented, it can be used in a mosaic pattern color separation filter even in frame transfer type CCD solid-state color imaging devices wherein the elements cannot be sufficiently separated in the vertical direction, and a high resolution, low flicker playback image can be obtained.

Furthermore, production of the color separation filter does not require the addition of any particular processes because a shield area between elements is not required, and an increase in the production processes can be prevented.

Although the present invention has been fully described in connection with the preferred embodiment thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A solid-state color imaging device comprising:
   a plurality of photoreceptor elements aligned vertically in columns and horizontally in rows, transfer electrode means associated with each element and extending in the boundary region between adjacent rows of the elements, first filter means overlying each of said rows of elements to make each element individually sensitive to light of a particular color; and
   white band filter means extending in horizontal rows in the boundary regions between the adjacent rows of photoreceptor elements, each row of said white band filter means being between two rows of said first filter means and bridging two adjacent rows of the horizontally aligned photoreceptor elements at the top and bottom thereof to reduce color signal mixing caused by charge overflow from one row of photoreceptor elements into the next adjacent row of photoreceptor elements, the surface area of the white band filter means bridging the photoreceptor elements of two rows being less than that of the first filter means overlying an element.

2. A solid-state color imaging device comprising:
   a semiconductor substrate having a primary layer;
   channel separation means provided in said semiconductor substrate for separating said primary layer into channel areas extending parallel to each other;
   parallel rows of transfer electrodes provided on said semiconductor substrate in a direction orthogonal to said channel areas for controlling the potential in said semiconductor substrate and for dividing the primary layer into rows of photoreceptor elements extending parallel to each other;
   a segmented color separation filter means provided over said photoreceptor elements of said substrate, said color separation filter means being divided vertically along said channel areas and horizontally in rows along opposite sides of said substrate transfer electrodes into a plurality of segments which are aligned vertically and aligned horizontally in rows with a boundary area between adjacent rows, each divided filter segment passing incident light of a specific wavelength corresponding to the color of the filter segment; and
   white band filter means extending in horizontal rows and between adjacent rows of the color separation filter means segments in the boundary areas between the adjacent rows of the photoreceptor elements, and bridging the adjacent rows of the horizontally aligned photoreceptor elements at the top and bottom thereof to reduce color signal mixing caused by charge overflow from one row of elements to the next adjacent row of elements, the surface area of the white band filter means bridging the photoreceptor elements if two rows being less than that of the first filter means overlying an element.

3. A solid-state color imaging device according to claim 2, further comprising:
   a charge accumulation area for receiving and temporarily storing charges transferred by said transfer electrodes; and
   a horizontal data transfer portion for sequentially outputting the charged data from said charge accumulation area.

* * * * *